(12) United States Patent
Nakamura et al.

(10) Patent No.: US 8,125,551 B2
(45) Date of Patent: *Feb. 28, 2012

(54) SOLID-STATE IMAGE PICKUP DEVICE AND CONTROL METHOD THEREOF

(75) Inventors: Nobuo Nakamura, Kanagawa (JP); Shoji Kawahito, Shizuoka (JP); Hiroki Sato, Kanagawa (JP); Mizuho Higashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 193 days.

This patent is subject to a terminal disclaimer.

(21) Appl. No.: 12/477,739

(22) Filed: Jun. 3, 2009

(65) Prior Publication Data

US 2009/0237545 A1    Sep. 24, 2009

Related U.S. Application Data

(63) Continuation of application No. 10/458,599, filed on Jun. 10, 2003, now Pat. No. 7,573,518.

(30) Foreign Application Priority Data

Jun. 11, 2002  (JP) ................................. 2002-169862

(51) Int. Cl.
  *H04N 5/335* (2006.01)
  *H04N 5/235* (2006.01)
  *H04N 3/14* (2006.01)

(52) U.S. Cl. .................... 348/294; 348/229.1; 348/300; 348/302; 348/308

(58) Field of Classification Search .................. 348/294, 348/300, 301, 302, 308, 309
See application file for complete search history.

(56) References Cited

U.S. PATENT DOCUMENTS

| 5,892,540 | A  | * | 4/1999  | Kozlowski et al. | 348/300 |
| 6,747,264 | B2 |   | 6/2004  | Miida            |         |
| 6,844,897 | B1 | * | 1/2005  | Andersson        | 348/308 |
| 6,965,407 | B2 | * | 11/2005 | Boemler et al.   | 348/302 |
| 7,573,518 | B2 | * | 8/2009  | Nakamura et al.  | 348/302 |
| 2005/0168602 | A1 |  | 8/2005  | Sumi et al.      |         |

FOREIGN PATENT DOCUMENTS

| JP | 59-151455  | 8/1984 |
| JP | 61-105979  | 5/1986 |
| JP | 62-154980  | 7/1987 |
| JP | 01-212921  | 8/1989 |
| JP | 03-107831  | 5/1991 |
| JP | 04-165821  | 6/1992 |

(Continued)

*Primary Examiner* — David Ometz
*Assistant Examiner* — Quang Le
(74) *Attorney, Agent, or Firm* — Robert J. Depke; Rockey, Depke & Lyons, LLC

(57) ABSTRACT

An image sensor controls the gain of a pixel signal on a pixel-by-pixel basis and extends a dynamic range while maintaining a S/N ratio at a favorable level. A column unit in an image sensor is independently detects a level of each pixel signal and independently sets a gain for level of the signal. A photoelectric converting region unit has pixels arranged two-dimensionally with a vertical signal line for each pixel column to output each pixel signal. The column unit is on an output side of the vertical signal line. The column unit for each pixel column has a pixel signal level detecting circuit, a programmable gain control, a sample and hold (S/H) circuit. Gain correction is performed according to a result of a detected level of the pixel signal.

5 Claims, 12 Drawing Sheets

FOREIGN PATENT DOCUMENTS

| | | |
|---|---|---|
| JP | 05-291955 | 11/1993 |
| JP | 05-315962 | 11/1993 |
| JP | 06-061858 | 3/1994 |
| JP | 10-163871 | 6/1998 |
| JP | 10-209868 | 8/1998 |
| JP | 2001-257593 | 9/2001 |
| JP | 2002-124877 | 4/2002 |
| WO | WO 00/45592 | 8/2000 |

* cited by examiner

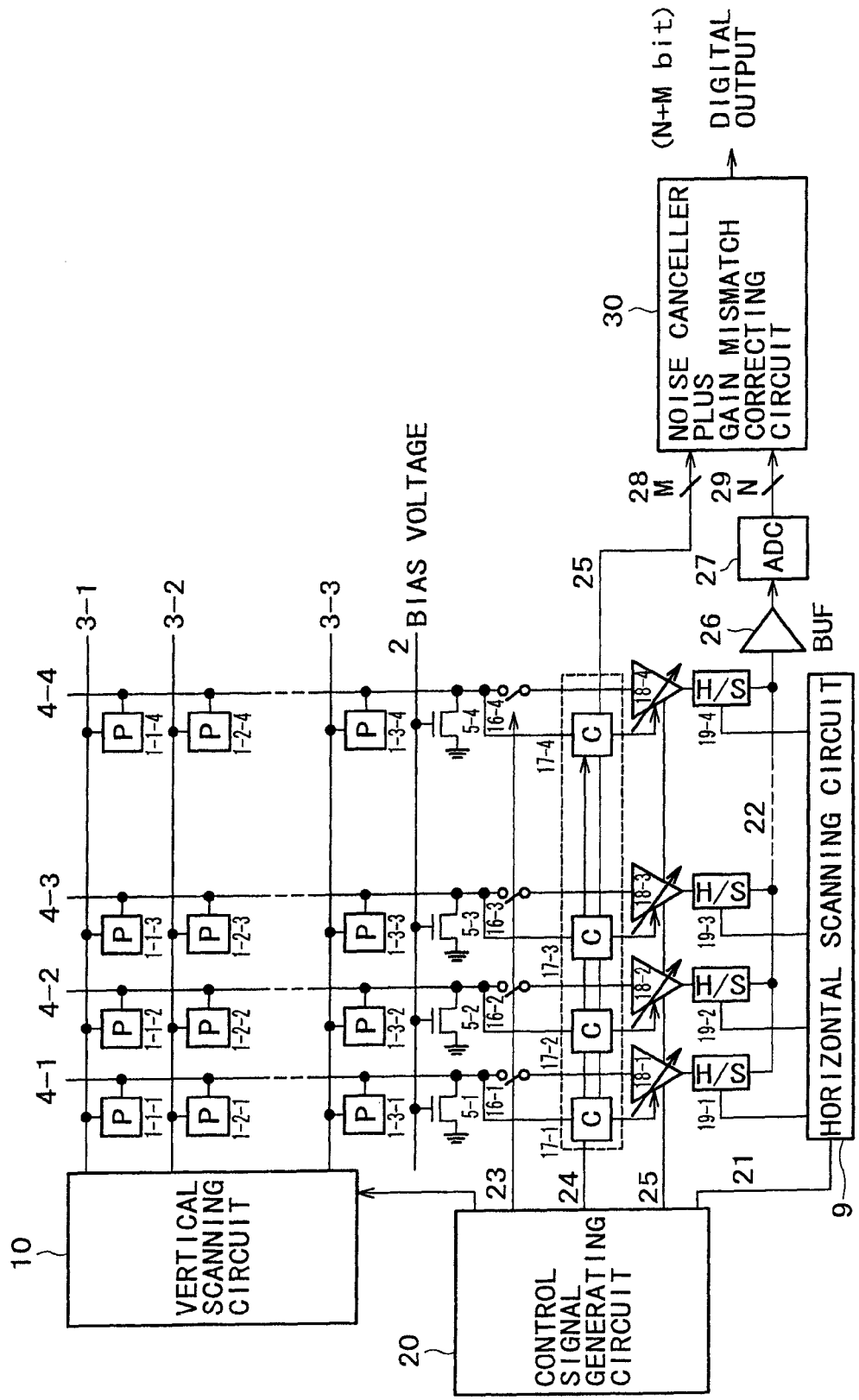
F I G. 1

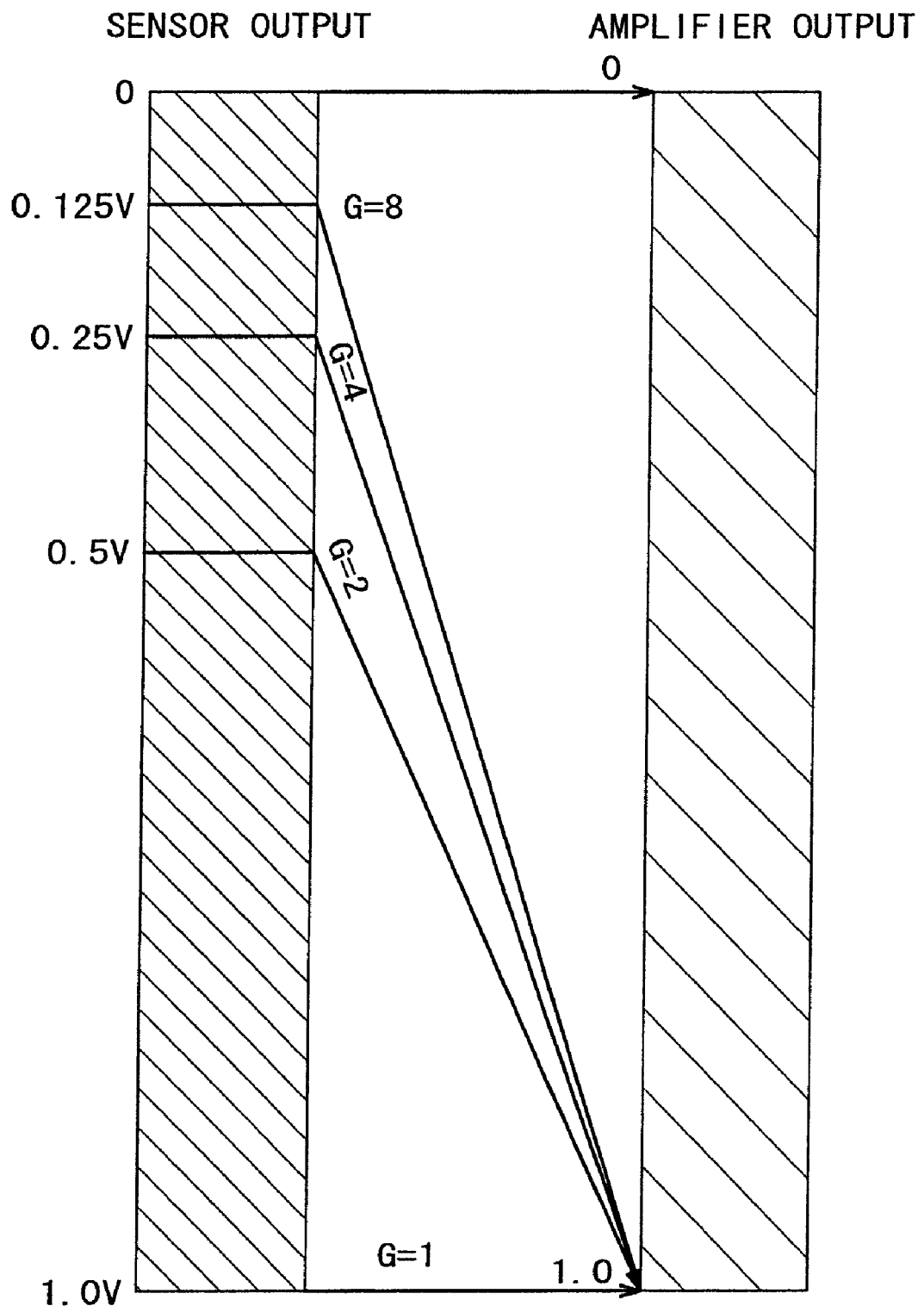
F I G. 4

SOLID-STATE IMAGE PICKUP DEVICE AND CONTROL METHOD THEREOF

The subject matter of application Ser. No. 10/458,599, is incorporated herein by reference. The present application is a Continuation of U.S. Ser. No. 10/458,599, filed Jun. 10, 2003, which claims priority to Japanese Patent Application Number JP 2002-169862, filed Jun. 11, 2002, in JAPAN The present application claims priority to these previously filed applications.

BACKGROUND OF THE INVENTION

1. Field of the Invention

The present invention relates generally to the field of solid-state image pickup devices such as a CMOS image sensors. More specifically, the present invention is directed to a solid-state image pickup device using a so-called column system and a method of controlling the device such that a pixel signal obtained by a photoelectric converting region unit is sequentially stored in a column region unit provided for each pixel column and the column region unit is sequentially selected to sequentially output each pixel signal.

2. Description of the Related Art

FIG. 12 is a circuit diagram showing an example of configuration of a CMOS image sensor using a column system. The CMOS image sensor includes, on a semiconductor substrate (not shown): a photoelectric converting region unit 1 formed by a two-dimensional pixel array; a horizontal scanning circuit 9 for making a selection in the horizontal direction; a vertical scanning circuit 10 for making a selection in the vertical direction; a timing generator unit 11 for generating various timing signals; an output amplifier 12 for amplifying a pixel signal; a PGA (programmable gain control amplifier) circuit 13; an AD (analog-to-digital conversion) circuit 14; and the like.

The CMOS image sensor uses a column system in which a capacitor 6 is provided for each pixel column in a part referred to as a column region provided on an output side of the photoelectric converting region unit 1, and a signal read from each pixel is sequentially stored in the capacitor and sequentially output to the output amplifier 12. Since signal processing on each pixel signal is performed after reading the pixel signal in a unit of a pixel column, a configuration within each unit pixel is simplified as compared with a device that performs similar signal processing within each unit pixel, so that provision can be made for an increase in the number of pixels, reduction in size, reduction in cost and the like of the image sensor.

Operation of such a circuit will next be described briefly. The photoelectric converting region unit 1 for receiving light signals includes a plurality of unit pixels P (1-1-1, 1-1-2, 1-1-3, . . . ) arranged in a row and a column direction. Such a unit pixel includes therein at least one photoelectric converting device. As the photoelectric converting device, a photodiode or a photogate is generally used.

For pixel signals to be output from the photoelectric converting region unit 1, the vertical scanning circuit 10 selects a predetermined row in order via a control line 3 (3-1, 3-2, 3-3, . . . ).

Incidentally, while only one control line 3 is shown in each pixel row in FIG. 12, a plurality of control lines 3 are generally provided in parallel with each other in each pixel row for the vertical scanning circuit 10 so that it may select each pixel row in order to read pixel signals.

Then the signals of the row selected via the control line 3 are sequentially stored in capacitors 6 (6-1, 6-2, 6-3, . . . ) of column region units disposed in parallel on the output side of the photoelectric converting region unit 1. The operation of storing the signals from the row is performed simultaneously.

The pixel signals stored in the capacitors 6 of the column region units are sequentially selected by operation of the horizontal scanning circuit 9 scanning columns from a leftmost one in order. That is, the horizontal scanning circuit 9 selects and drives column selecting transistors 7 (7-1, 7-2, 7-3, . . . ) in order. Thereby the pixel signal of each of the pixels P is read in order.

The output amplifier 12 sequentially amplifies the pixel signal output to a horizontal signal line 8 and then outputs the result as a voltage signal. The PGA circuit 13 amplifies voltage of the voltage signal in small gain steps. The voltage-amplified pixel signal is input to the AD circuit 14, and then output as a digital signal 15 to the outside of the semiconductor chip.

Incidentally, a vertical signal line is supplied with a fixed bias voltage by a bias circuit 2 via load transistors 5 (5-1, 5-2, 5-3, . . . ). The AD circuit 14 now developed and used in the conventional solid-state image pickup device described above generally has a bit precision of 12 bits or 14 bits. When the number of bits of the AD circuit 14 is increased, power consumption is increased and noise of the circuit itself makes it particularly difficult to improve the bit precision.

Thus the conventional image sensor using the column system has problems in that it is difficult to improve the bit precision and it is not possible to extend the dynamic range while maintaining the S/N ratio at a favorable level.

Incidentally, when the gain of a pixel signal is controlled on a pixel-by-pixel basis within each pixel of the photoelectric converting region unit 1, the photoelectric converting region unit can improve the bit precision and extend the dynamic range of an output signal. In this case, however, the configuration of each pixel becomes complicated, and hence advantages of reduction in cost and reduction in size provided by the above-described column system cannot be obtained.

It is accordingly an object of the present invention to provide a solid-state image pickup device and a control method thereof that make it possible to control the gain of the pixel signal on a pixel-by-pixel basis and extend the dynamic range while maintaining the S/N ratio at a favorable level even in a circuit configuration using the column system. Other objects and advantages of the present invention will be apparent in light of the following Summary and Detailed Description of the presently preferred embodiments.

SUMMARY OF THE INVENTION

In order to achieve the above object, according to the present invention, there is provided a solid-state image pickup device comprising: a photoelectric converting region unit having a plurality of unit pixels, each including at least a photoelectric converting device, disposed in a two-dimensional array; a vertical signal line disposed for each pixel column of the photoelectric converting region unit, for sequentially reading a pixel signal generated in each unit pixel of the photoelectric converting region unit; a column region unit disposed on an output side of the photoelectric converting region unit, for sequentially storing the pixel signal of each unit pixel read by the vertical signal line; and an output unit for sequentially reading the pixel signal stored in the column region unit and outputting the pixel signal; wherein the column region unit has therein pixel control means for detecting a level of the pixel signal read by the vertical signal line on a pixel-by-pixel basis and controlling a gain of the pixel signal on the pixel-by-pixel basis for output.

Further, according to the present invention, there is provided an electronic apparatus including a solid-state image pickup device, the solid-state image pickup device including: a photoelectric converting region unit having a plurality of unit pixels, each including at least a photoelectric converting device, disposed in a two-dimensional array; a vertical signal line disposed for each pixel column of the photoelectric converting region unit, for sequentially reading a pixel signal generated in each unit pixel of the photoelectric converting region unit; a column region unit disposed on an output side of the photoelectric converting region unit, for sequentially storing the pixel signal of each unit pixel read by the vertical signal line; and an output unit for sequentially reading the pixel signal stored in the column region unit and outputting the pixel signal, the electronic apparatus characterized in that: the column region unit of the solid-state image pickup device has therein pixel control means for detecting a level of the pixel signal read by the vertical signal line on a pixel-by-pixel basis and controlling a gain of the pixel signal on the pixel-by-pixel basis for output.

Further, according to the present invention, there is provided a control method of a solid-state image pickup device, the solid-state image pickup device including: a photoelectric converting region unit having a plurality of unit pixels, each including at least a photoelectric converting device, disposed in a two-dimensional array; a vertical signal line disposed for each pixel column of the photoelectric converting region unit, for sequentially reading a pixel signal generated in each unit pixel of the photoelectric converting region unit; a column region unit disposed on an output side of the photoelectric converting region unit, for sequentially storing the pixel signal of each unit pixel read by the vertical signal line; and an output unit for sequentially reading the pixel signal stored in the column region unit and outputting the pixel signal, the method characterized by comprising: detecting level of the pixel signal read by the vertical signal line on a pixel-by-pixel basis and controlling a gain of the pixel signal on the pixel-by-pixel basis for output in the column region unit.

Further, according to the present invention, there is provided a solid-state image pickup device characterized by comprising: a photoelectric converting region unit having a plurality of unit pixels, each including at least a photoelectric converting device, disposed in a form of a two-dimensional array; a vertical signal line disposed for each pixel column of the photoelectric converting region unit, for sequentially reading a pixel signal generated in each unit pixel of the photoelectric converting region unit; a column region unit disposed on an output side of the photoelectric converting region unit, for sequentially storing the pixel signal of each unit pixel read by the vertical signal line; and an output unit for sequentially reading the pixel signal stored in the column region unit and outputting the pixel signal; wherein the column region unit has therein pixel control means for detecting level of the pixel signal read by the vertical signal line and subjecting the pixel signal to processing on a pixel column-by-pixel column basis for output.

With the solid-state image pickup device and the control method thereof according to the present invention, the level of the pixel signal read by the vertical signal line is detected on the pixel-by-pixel basis in the column region unit, and the gain of the pixel signal is controlled on the pixel-by-pixel basis for output. Therefore, even with a circuit configuration using the column system, the gain of the pixel signal can be controlled on a pixel-by-pixel basis, and hence the dynamic range can be extended while maintaining the S/N ratio at a favorable level. It is thus possible to readily provide improvement in picture quality, reduce costs and size, while increasing the number of pixels and the like of the solid-state image pickup device.

Further, in an electronic apparatus having such a solid-state image pickup device, improvement in picture quality, reduction in cost, reduction in size, increase in the number of pixels and the like of an image pickup unit thereof can be readily achieved, thereby contributing to enhancing the functions of the electronic apparatus.

BRIEF DESCRIPTION OF THE DRAWINGS

FIG. 1 is a circuit diagram showing a first exemplary embodiment illustrating a configuration of a CMOS image sensor of the present invention;

FIG. 4 is a diagram illustrating a gain setting method of an amplifying circuit according to a fourth exemplary embodiment of the present invention;

DETAILED DESCRIPTION OF THE INVENTION

Preferred embodiments of a solid-state image pickup device and a control method thereof according to the present invention will hereinafter be described.

According to the embodiments, a column region unit in a CMOS image sensor with a column system as described above is provided for each pixel column. This unit performs a function of independently detecting the level of each pixel signal and independently setting a gain for the level of the signal. Thereby with a simple circuit configuration and minute pixels, the embodiments improve an S/N ratio of each pixel and extend the dynamic range thereof. Specifically, with the column system, 16-bit precision can be achieved.

Figure 12:
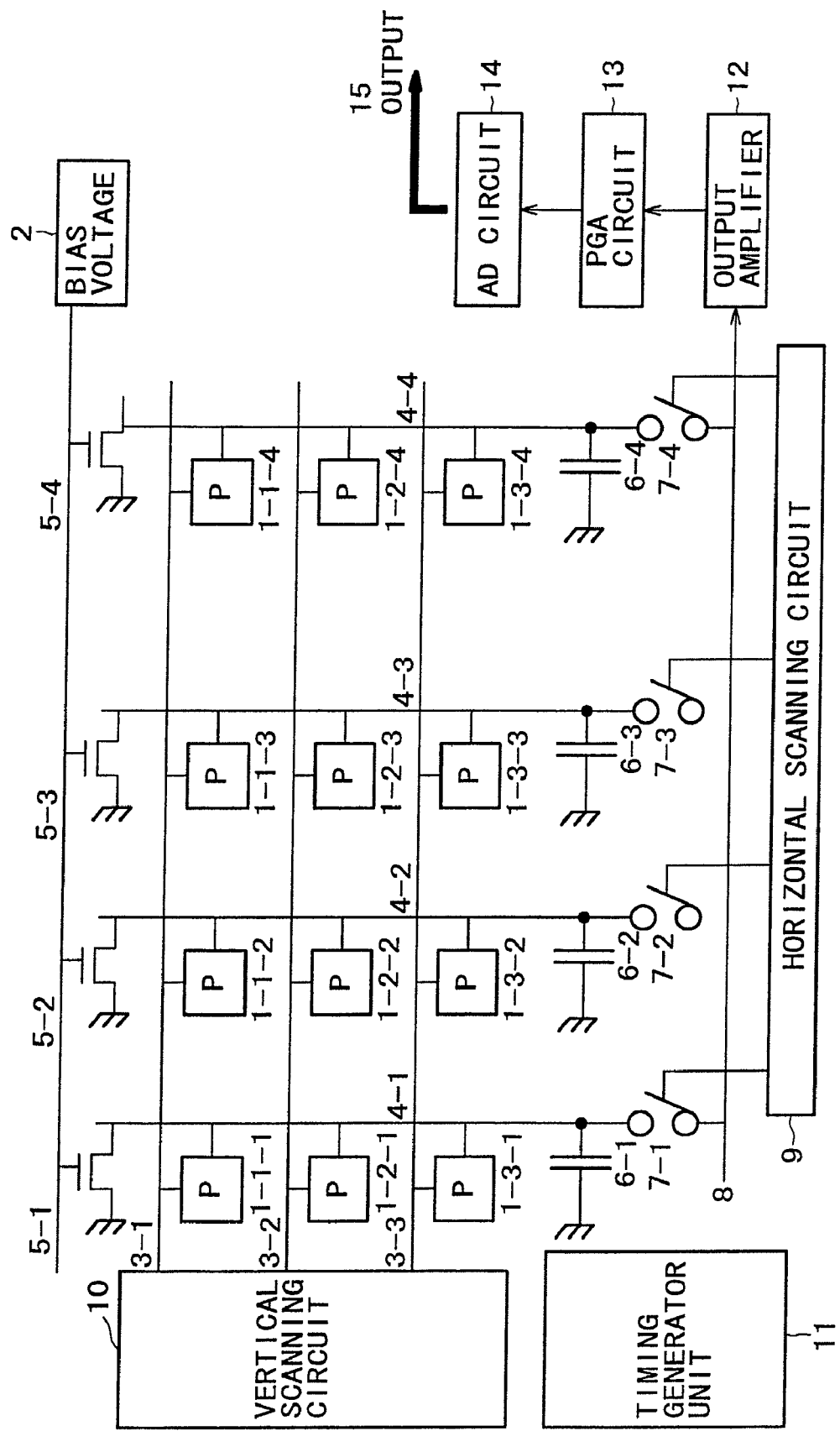
FIG. 12 is a circuit diagram showing an example of configuration of a conventional CMOS image sensor using a column system.

FIG. 1 is a circuit diagram showing a first exemplary embodiment of a configuration of a CMOS image sensor, which is of assistance in explaining principles of the embodiments of the present invention. Incidentally, a configuration common with the conventional example shown in FIG. 12 is described using the same reference numerals.

The CMOS image sensor comprises: a photoelectric converting region unit 1 (unit pixels 1-1-1, 1-1-2, . . . ); a vertical scanning circuit 10; a horizontal scanning circuit 9; a control line 3 (3-1, 3-2, 3-3) connected to the vertical scanning circuit 10; a vertical signal line 4 (4-1, 4-2, 4-3, 4-4, . . . ); a load MOS transistor 5 (5-1, 5-2, 5-3, 5-4, . . . ); a detecting circuit (comparator) 17 (17-1, 17-2, 17-3, 17-4, . . . ) for detecting a signal level of an input signal; a programmable gain control (PGA) circuit 18 (18-1, 18-2, 18-3, . . . ); a sample and hold (S/H) circuit 19 (19-1, 19-2, 19-3, . . . ); a control signal generating circuit 20; a comparator output line 25; an output signal line 22; an output buffer 26; an AD converter (ADC) 27; and a noise canceller plus gain mismatch correcting circuit 30.

Operating principles of such a CMOS image sensor will next be described. From the vertical signal line 4 (4-1, 4-2, 4-3, . . . ), a signal voltage Vsig is mainly output. The detecting circuit C17 compares the signal voltage Vsig with predetermined reference voltages.

For example, the reference voltages are 500 mV, 250 mV, and 125 mV. These values correspond to a saturation signal of 1 V of the vertical signal line 4. That is, 1 V is divided into eight regions of 125 mV.

A comparison output of the detecting circuit C17 is a code output (division signal) based on the following rule.

Vsig<125 mV . . . code 000 125 mV=<Vsig<250 mV . . . code 001 250 mV=<Vsig<375 mV . . . code 002 375 mV=<Vsig<500 mV . . . code 003 500 mV=<Vsig<625 mV . . . code 004 625 mV=<Vsig<750 mV . . . code 005 750 mV=<Vsig<875 mV . . . code 006 875 mV=<Vsig<1000 mV . . . code 007

Specifically, when Vsig=300 mV, for example, a 3-bit digital signal of a code "002" is output from the wiring 25 to the outside of the column region unit. When Vsig=100 mV, a 3-bit digital signal of a code "000" is output from the wiring 25 to the outside of the column region unit.

The detecting circuit C17 outputs the comparison output also to the PGA circuit 18 (18-1, 18-2, 18-3, . . . ).

When Vsig=300 mV, for example, a gain of the PGA circuit 18 is multiplied by two by control of the code signal "002" from the detecting circuit C17. When Vsig=100 mV, the gain of the PGA circuit 18 is multiplied by eight. Thus, in this example, the PGA circuit 18 converts the input signal voltage Vsig into a high voltage.

Hence, conventionally a small signal (100 mV in this case) is used as it is, resulting in a low S/N ratio and only an image with much noise. On the other hand, in the first embodiment, the input signal equivalently becomes 800 mV, thus resulting in an image quality with a high S/N ratio.

Further, when the number of bits of the ADC circuit 27 is 10 and Vsig=100 mV, for example, only a precision of 6 bits to 7 bits was possible. In the first embodiment, a precision of 9 bits to 10 bits can be achieved. This is equivalent to increasing 10-bit-performance of the ADC circuit 27 to 13 bits. Besides, since the PGA gain can be set for each pixel signal, it is very convenient in obtaining a large number of AD bits. Further, when the reference voltages of the detecting circuit C17 are increased in number to four, a 4-bit precision can be achieved, and an analog signal with a high S/N ratio can be obtained.

As is understood from the circuit configuration of FIG. 1, the detecting circuit C17 for detecting the signal level of each vertical signal line 4 is disposed in each column, whereby the gain of the PGA circuit 18 can be applied to each pixel.

Finally, the noise canceller plus gain mismatch correcting circuit 30 provides a digital output signal of M+N bits on the basis of the thus output detection signal (a digital signal of M bits in this example) of the detecting circuit C17 and the pixel signal output (a digital signal of N bits in this example). The noise canceller plus gain mismatch correcting circuit 30 further performs digital noise canceling and gain mismatch correcting processing. Details of the processing will be described later.

Figure 2:
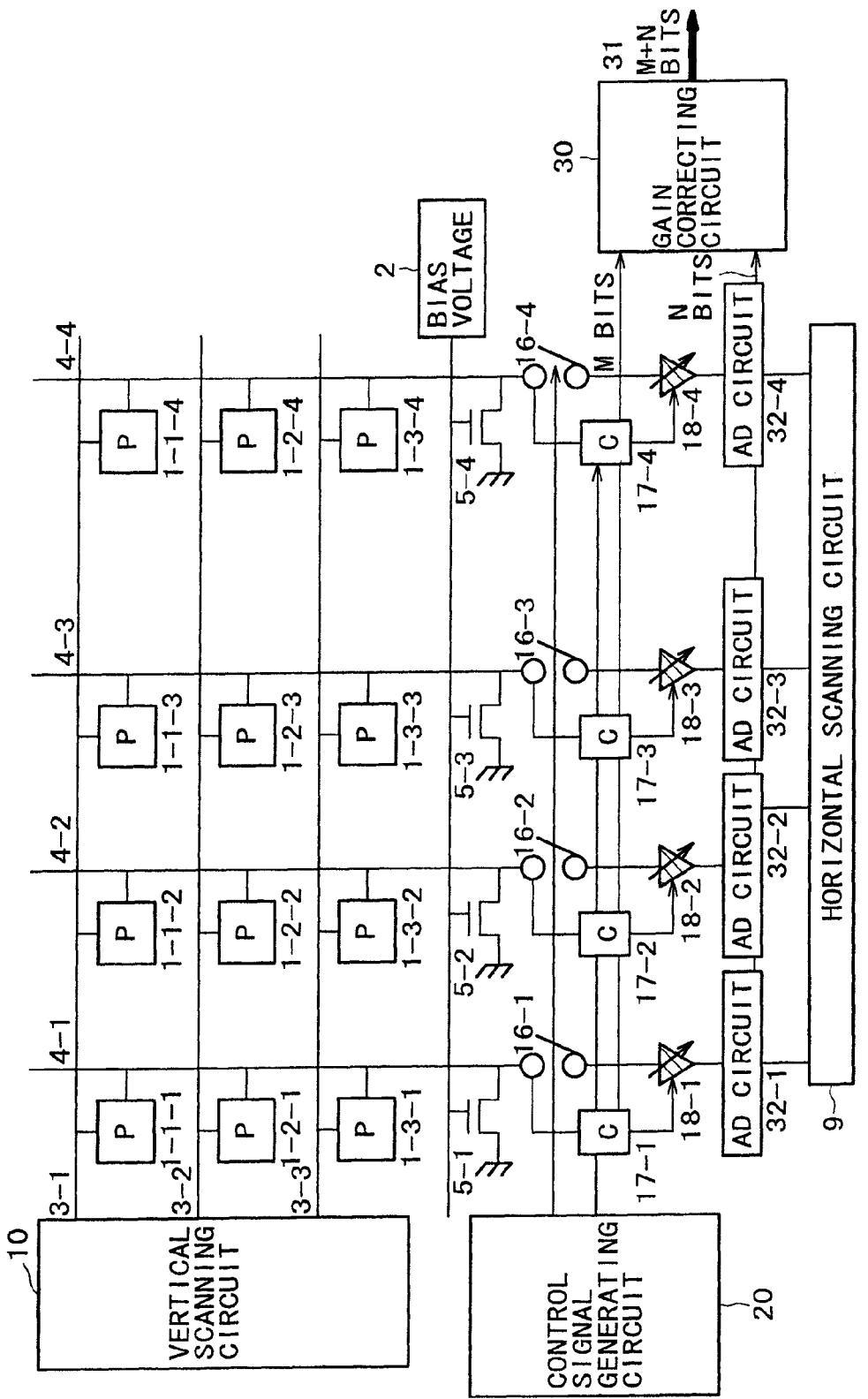
FIG. 2 is a circuit diagram showing a CMOS image sensor according to a second exemplary embodiment of the present invention.

FIG. 2 is a circuit diagram showing a second embodiment of a CMOS image sensor. While in the foregoing first embodiment, an example of the CMOS image sensor that produces only analog output at each pixel is shown, an example of a digital output type solid-state image pickup device including an AD circuit in a column region unit will be described in the second embodiment.

The CMOS image sensor comprises: a photoelectric converting region unit 1 (unit pixels 1-1-1, 1-1-2, . . . ); a vertical signal line 4 (4-1, 4-2, . . . ); a vertical scanning circuit 10; a horizontal scanning circuit 9; a control signal generating circuit 20; a detecting circuit 17 (17-1, 17-2, . . . ); an amplifying circuit 18 (18-1, 18-2, . . . ); an AD circuit 32 (32-1, 32-2, . . . ); a bias circuit 2; and a gain correcting circuit 30.

This example has the detecting circuit 17, the amplifying circuit 18, and the AD circuit 32 for each column region unit corresponding to each pixel column, so that each column region unit can form a digital signal.

In this example, the detecting circuit 17 detects a signal level of the vertical signal line 4. A result of the detection is supplied to the amplifying circuit 18 to set a gain of the amplifying circuit 18 to an optimum value. The amplifying circuit 18 amplifies a signal and supplies the signal to the AD circuit 32 in a succeeding stage.

The AD circuit 32 converts the analog signal into a digital signal in each column. The result is output to the outside of the column region. In this example, the detecting circuit 17 has information of N bits and the AD circuit output has information of M bits. Hence, by using this method, information of N+M bits can be obtained. The gain correcting circuit 30 carries out this method.

Figure 3:
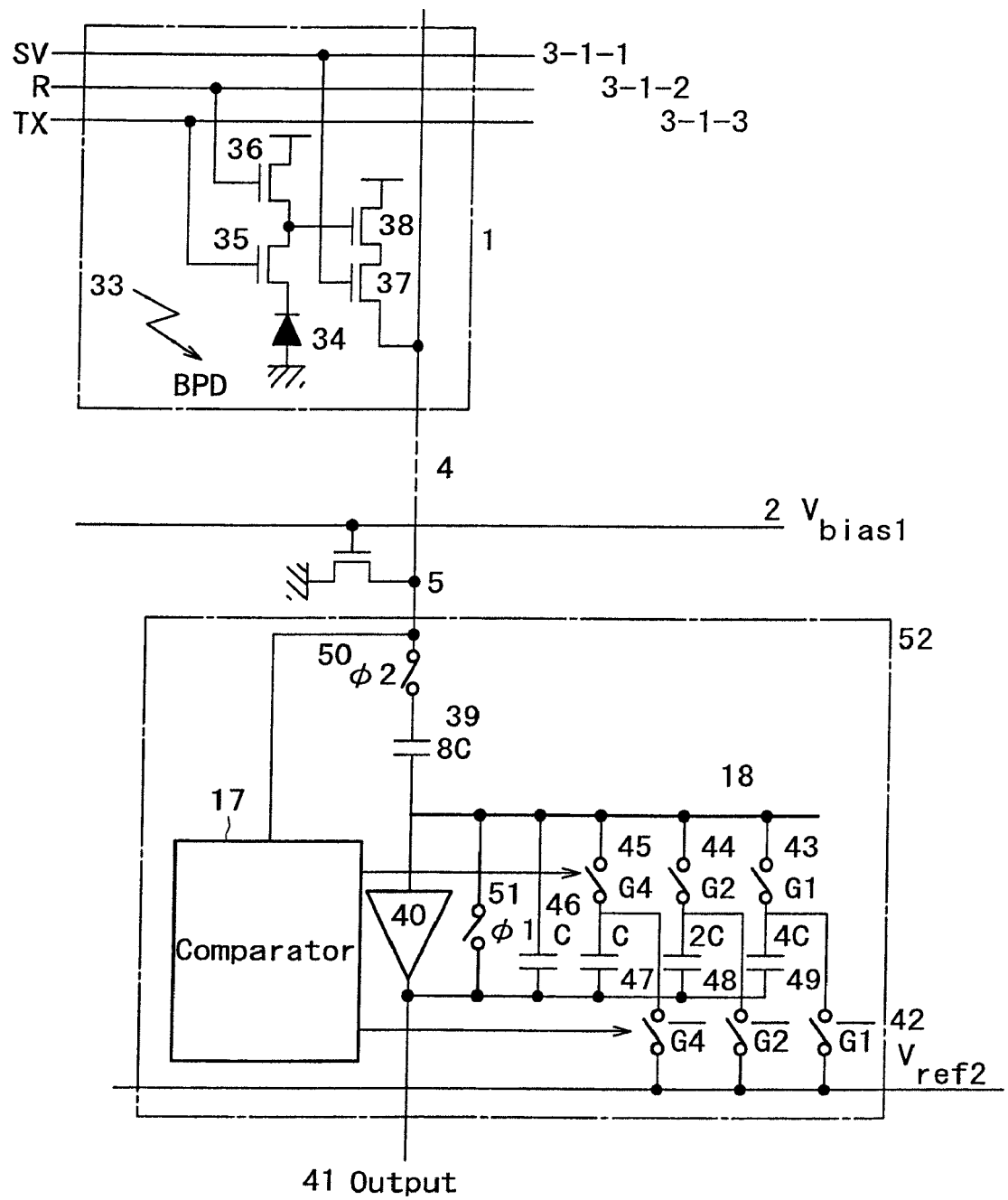
FIG. 3 is a circuit diagram showing a CMOS image sensor according to a third exemplary embodiment of the present invention.

FIG. 3 is a circuit diagram showing a third exemplary embodiment of a CMOS image sensor. In this example, each unit pixel forming a photoelectric converting region unit 1 includes, for example, a photodiode unit 34, a transfer gate 35, a reset gate 36, an amplifying gate 38, a selecting gate 37 and the like.

Each unit pixel is controlled by a selecting signal line SV3-1-1, a reset signal line R3-1-2, and a transfer signal line TX3-1-3. A vertical signal line 4 is connected with a load transistor 5, and thus operates as a source follower circuit. The vertical signal line 4 is also connected to a detecting circuit 17 and connected to an amplifying circuit 40 via a switch 50 (controlled by φ2) and a capacitance 39.

A capacitance value of a capacitance connected to an OP-amp (amplifier) 40 can be varied from C to 8C by controlling switches 43 to 45. Thus, the amplifying circuit 18 forms a programmable gain amplifier whose gain can be varied from one to eight by a ratio between a capacitance value 8C of the capacitance 39 and a capacitance value C to 8C of capacitances 46 to 49 which value depends on a state of connection thereof.

The detecting circuit (comparator in this example) 17 detects a signal level of the vertical signal line 4. The detecting circuit 17 determines the level of the gain such that an output signal 41 of the OP-amp 40 is of a maximum value within a range lower than a saturation signal level.

Such a method can minimize the level of input signal converting noise occurring in an amplifying circuit 52. Also, the output signal 41 can be increased in level so as to become close to the saturation signal in each pixel, thus providing an advantage against noise occurring subsequently.

Incidentally, while in this example, the gain of the amplifying circuit 52 is changed by a capacitance division ratio, the gain of the amplifying circuit 52 can also be changed by resistance division.

FIG. 4 is a diagram which explains a first example of a gain setting method of the amplifying circuit 52 according to a fourth embodiment of the present invention. In this example, when an output signal of the vertical signal line 4 is 0 to 125 mV, the gain is set to eight. Then, even when an input signal is a maximum of 125 mV, an output signal of the OP-amp 40 is 1 V. That is, the output signal is output at 1 V when output to the outside of the column region unit. While the output signal is 1 V in this example, the voltage is set arbitrarily according to specifications of the solid-state image pickup device.

When 125 mV<the input signal=<250 mV, the gain of the amplifying circuit 52 is set to four. Similarly, when 250 mV<the input signal=<500 mV, the gain of the amplifying circuit 52 is set to two. When 500 mV<the input signal=<1 V, the gain of the amplifying circuit remains one.

By thus setting the gain of the amplifying circuit 52, it is possible to maximize a ratio of the signal to noise occurring in the amplifying circuit 52. This is essential in realizing a highly sensitive solid-state image pickup device.

Figure 5:
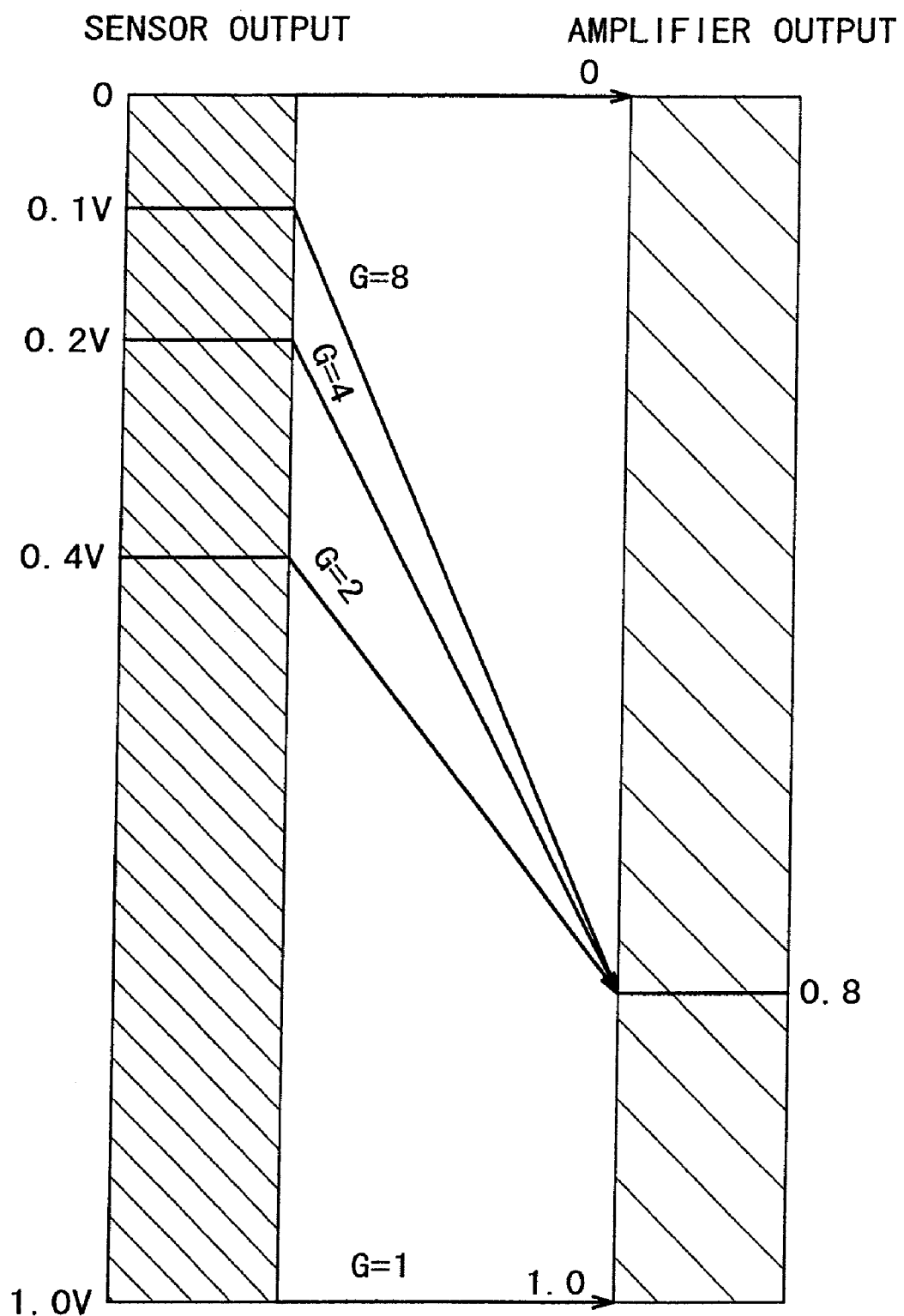
FIG. 5 illustrates a second example of a gain setting method for use with an amplifying circuit according to a fifth exemplary embodiment of the present invention.

FIG. 5 is a diagram which explains a second example of the gain setting method of the amplifying circuit 52 according to a fifth embodiment of the present invention.

In this example, while the saturation signal level is 1 V, a maximum value of the gain is set so as to produce 800 mV. Also in this case, for the same reason as in the foregoing example of FIG. 4, the S/N ratio when signal level is low can be maximized. That is, less susceptibility to effects of the amplifying circuit 52 is achieved.

It is to be noted that while in the examples of FIG. 4 and FIG. 5, four gains of one, two, four, and eight are provided, the gain can be set in much smaller steps and can be set to a much higher level. That is, the gain can be determined appropriately according to the particular application and the like.

Figure 6:
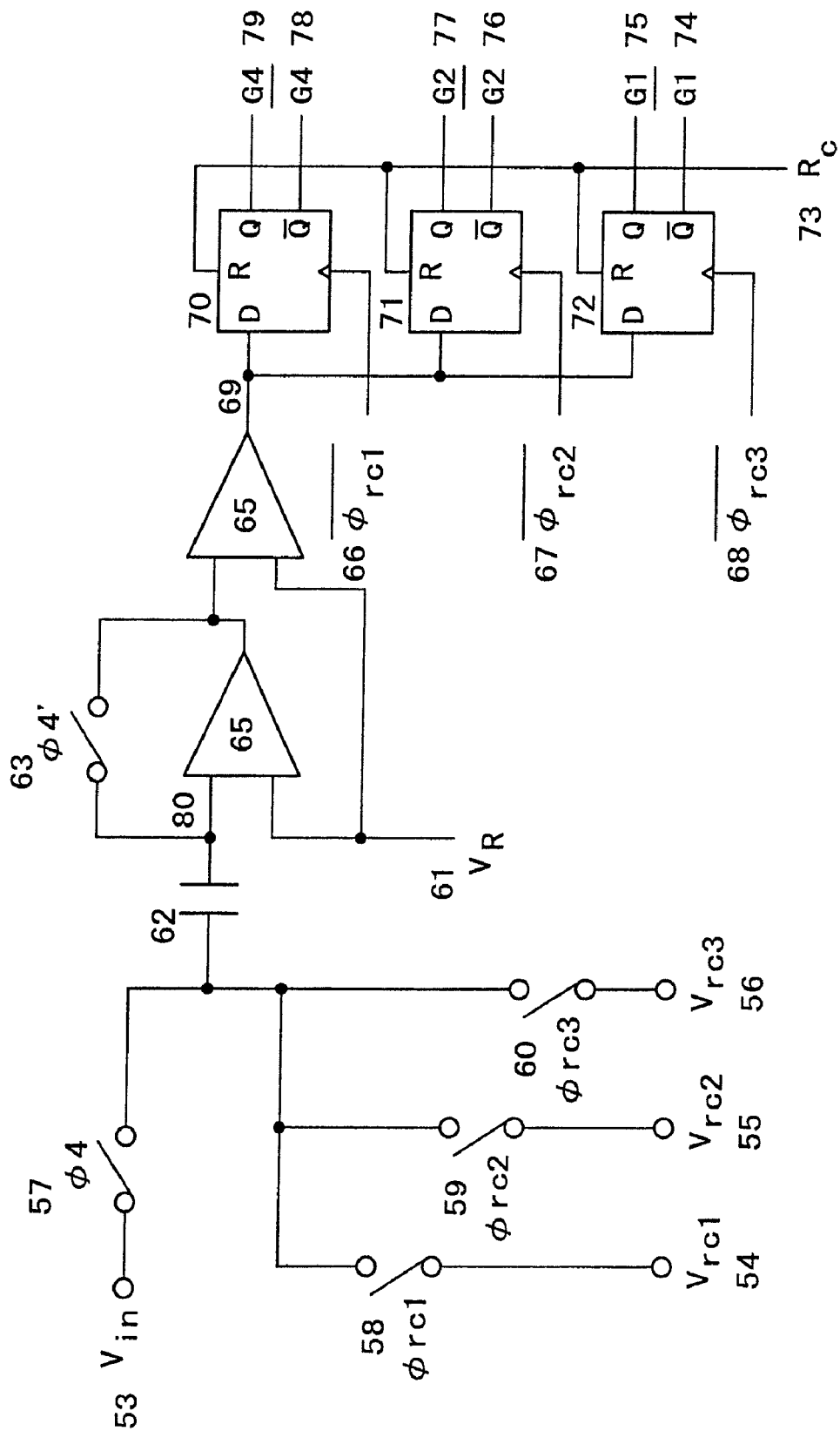
FIG. 6 is a block diagram showing an example of a detecting circuit formed in a column region unit according to a sixth exemplary embodiment of the present invention.

FIG. 6 shows a sixth exemplary embodiment of the present invention, or an example of a detecting circuit 17 formed in each column region unit. The detecting circuit 17 includes switches 57, 58, 59, 60, and 63, a capacitor 62, comparators 64 and 65, flip-flop circuits 70, 71, and 72 and the like.

In this configuration, a signal Vin 53 which is input from the vertical signal line 4 via the switch 57 is stored in an input node 80 of the comparator 64. The signal once stored is compared with comparison voltages Vrc1 (54), Vrc2 (55), and Vrc3 (56) by operation of the switches 58, 59, and 60.

Then, a result 69 of the three comparisons is written to the flip-flop circuits 70, 71, and 72 on the basis of synchronizing clocks 66, 67, and 68 (/φrc1 to /φrc3).

Thereby a range within which a level of the signal of the vertical signal line falls is known, and a level of the voltage can be classified. The result (division signal) is output as outputs 74 to 79 (G1, /G1, G2, /G2, G4, and /G4) of the flip-flop circuits 70, 71, and 72 on the basis of an output pulse Rc to the outside of the column region unit in conjunction with an output voltage.

Figure 7:
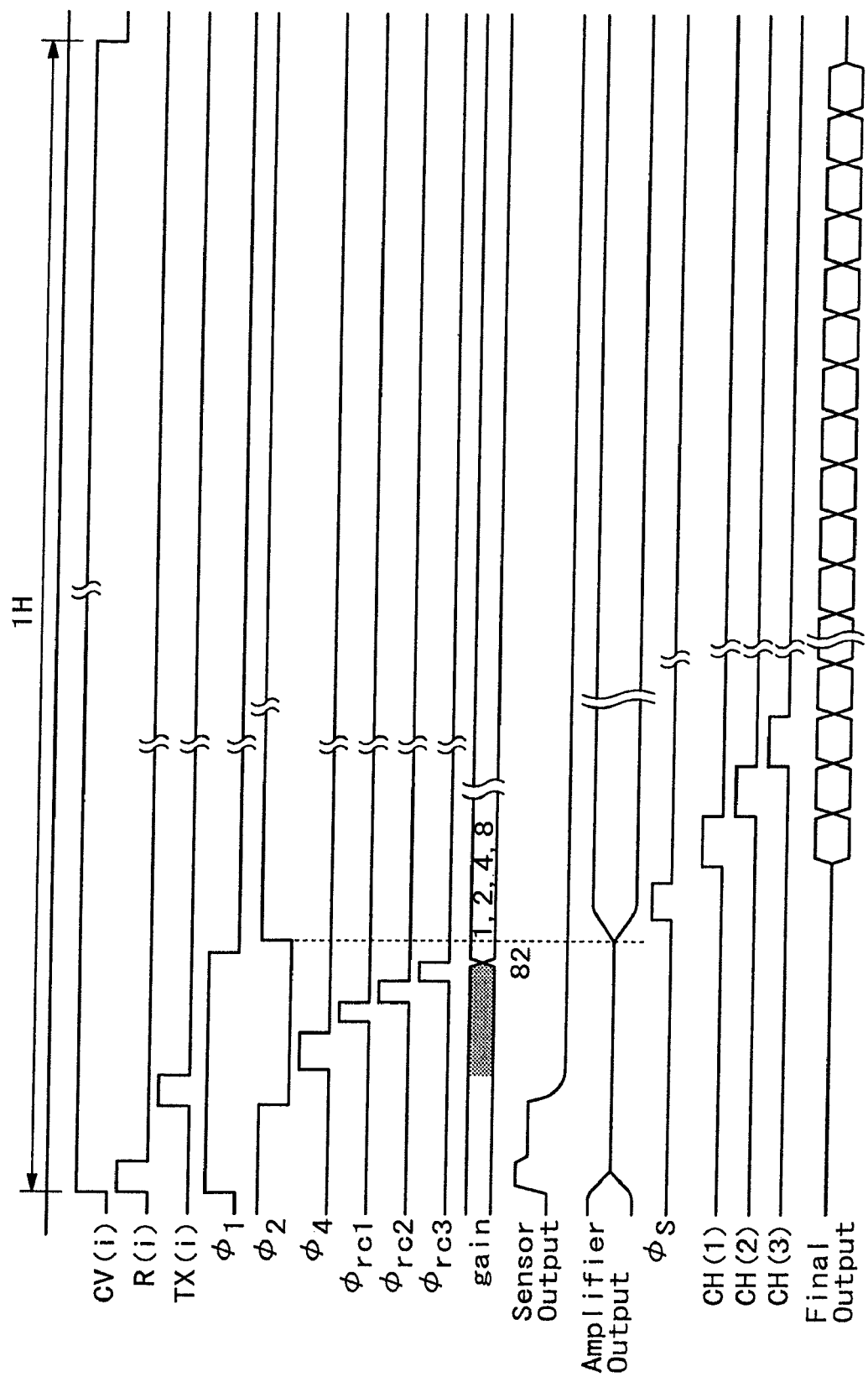
FIG. 7 is a timing chart showing timing operation during one horizontal period of a CMOS image sensor according to a seventh exemplary embodiment of the present invention.

FIG. 7 is a timing chart showing, as a seventh embodiment of the present invention, timing operation during one horizontal period of a CMOS image sensor which employs the embodiment. First, an amplifying circuit 18 is reset during an "H" period of a clock φ1. During the period when φ1="H," a floating diffusion amplifier of the pixel is reset by R(i). Then setting TX(i)="H," a signal of the photodiode is output to the floating diffusion amplifier. At this time, φ2="L" and therefore the amplifying circuit 18 remains reset.

Next, while φ1="H" and φ2="L," a detecting circuit 17 is operated by setting φ4="H," and φrc1 to φrc3 are sequentially selected to determine a gain corresponding to level of the signal.

When a comparison of φrc3 is ended, the gain of the amplifying circuit 18 is determined (82 in FIG. 7). After the operation of determining the gain is ended, φ1 is set to "L" and φ2 is set to "H" for the amplifying circuit 18 to amplify the signal of the vertical signal line 4. The amplified signal is output to the outside of the column region unit. Incidentally, the amplified signal may be directly output to the outside or may be thereafter sampled and held and then output. Thus, a small signal can be greatly amplified in the analog domain to thereby provide a signal with a high S/N ratio.

Figure 8:
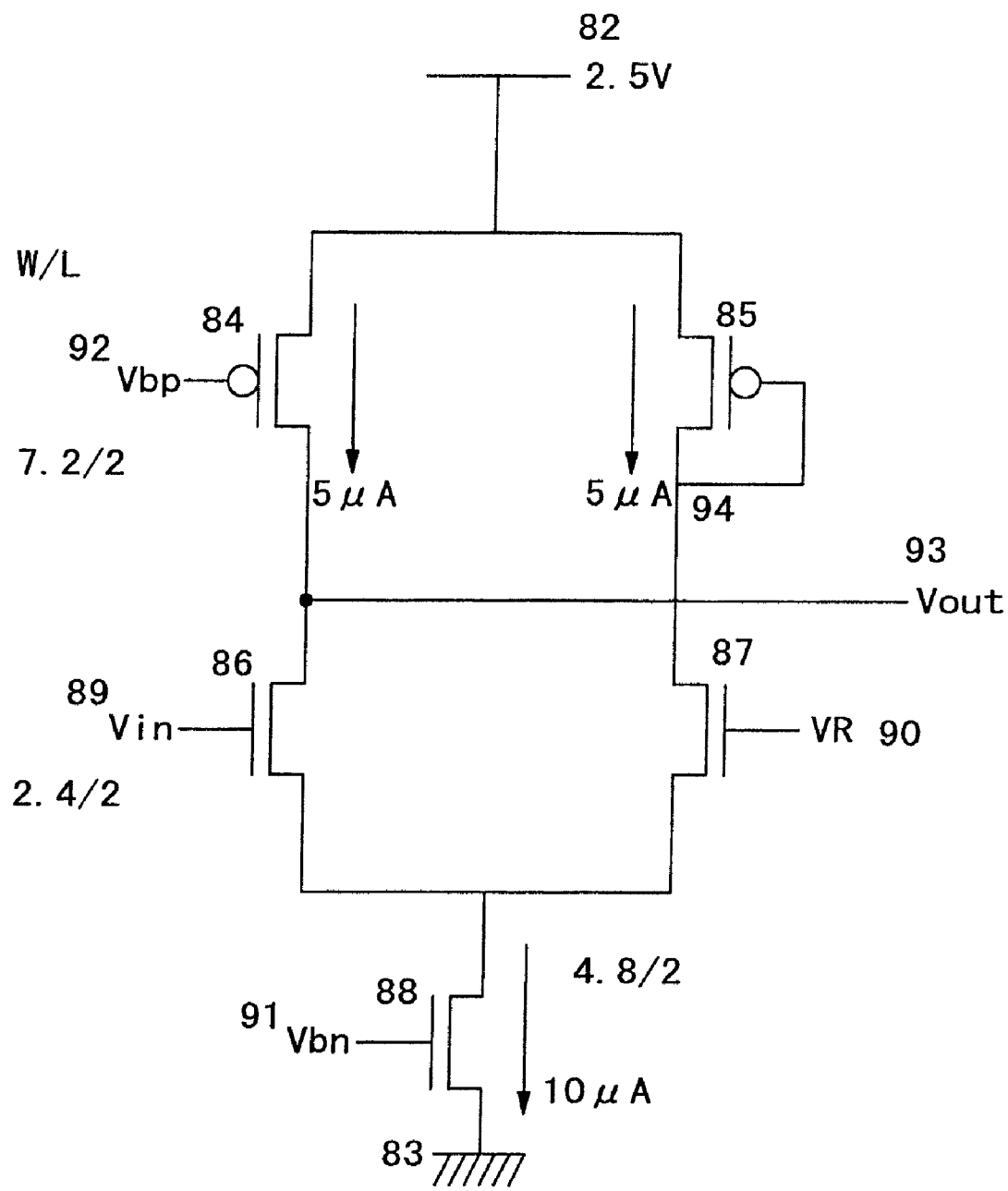
FIG. 8 is a circuit diagram showing an example of a differential amplifier forming a comparator for a detecting circuit according to an eighth exemplary embodiment of the present invention.

FIG. 8 is a circuit diagram showing an example of a differential amplifier forming the comparator 64 of the detecting circuit 17 shown in FIG. 6 as an eighth embodiment of the present invention. As shown in FIG. 8, the differential amplifier is formed by commonly connecting sources of a pair of transistors 86 and 87 that perform differential amplifier operation to a transistor 88 forming a constant-current source and connecting a pair of transistors 84 and 85 to drains of the transistors 86 and 87 by cascade connection.

Since the comparator can be formed by such a simple differential amplifier, for example, a circuit with a small number of components and a small column area can be realized. Incidentally, various signals 89 to 94, power supplies 82 and 83 and the like shown in FIG. 8 are not unique to the present invention, and therefore their description has been be omitted.

Figure 9:
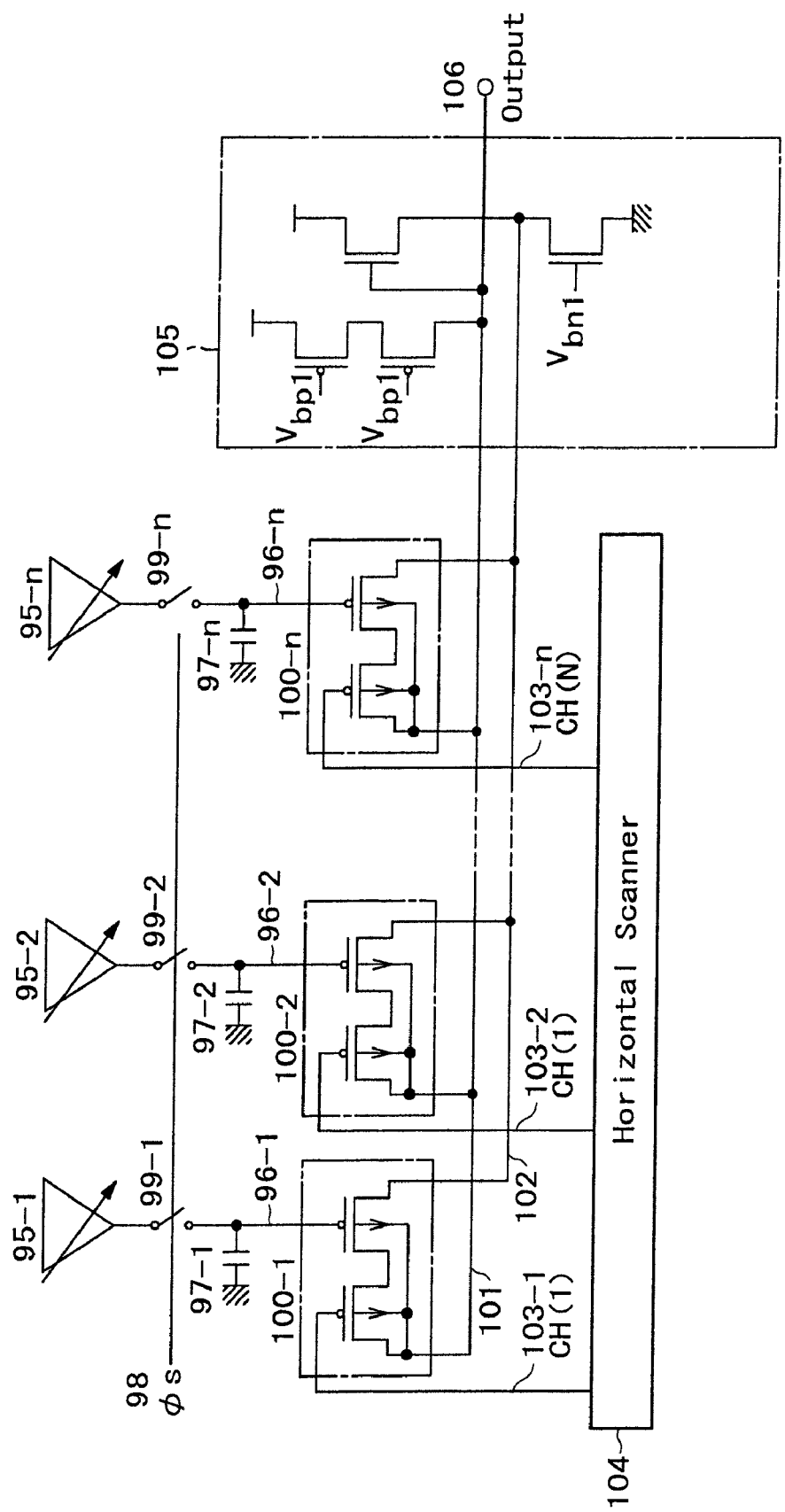
FIG. 9 is a block diagram illustrating an exemplary sample and hold circuit formed in a stage succeeding an amplifying circuit in a column region unit shown in FIG. 1.

FIG. 9 is a block diagram showing an example of the sample and hold circuit formed in a stage succeeding the amplifying circuit 18 in each column region unit.

In the sample and hold circuit, a capacitance C97 (97-1, 97-2, . . . , 97-n) for storing a signal and a reading circuit 100 (100-1, 100-2, . . . , 100-n) are formed.

A selection signal CH(i) 103 (103-1, 103-2, . . . , 103-n) from a horizontal selection register 104 selects a column desired to be read, and the signal from the capacitance 97 is output from an output signal line 101 by the reading circuit 100 and an external amplifying circuit 105.

Figure 10:
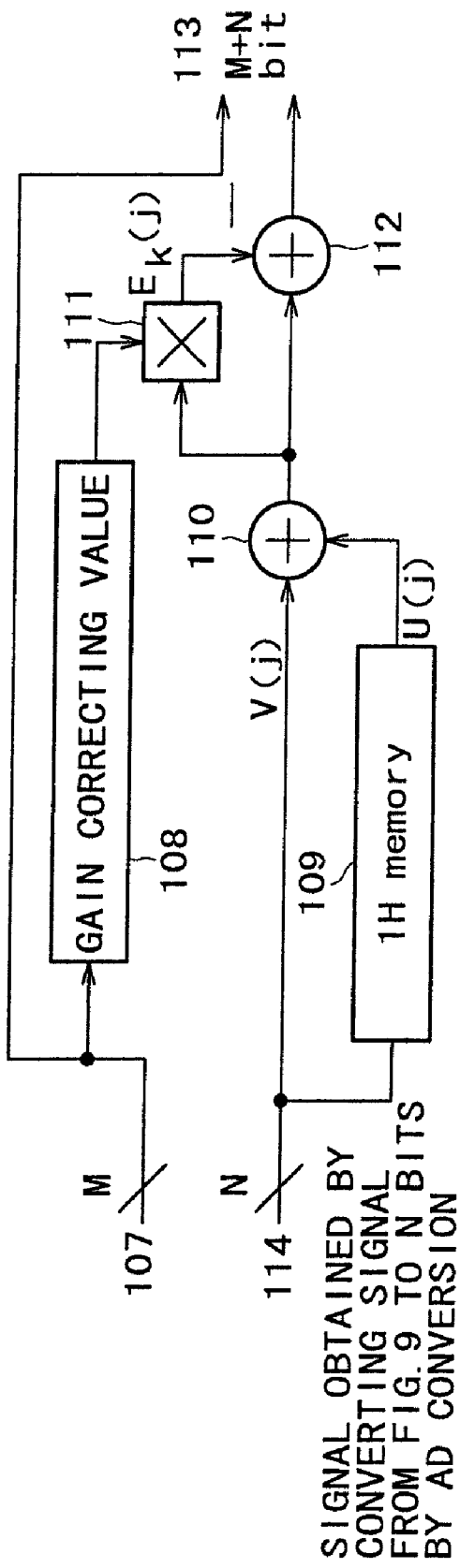
FIG. 10 is a block diagram illustrating an exemplary gain correcting circuit according to a ninth exemplary embodiment of the present invention.

FIG. 10 is a block diagram showing an example of configuration of the gain correcting circuit 30 shown in FIG. 2 as a ninth embodiment of the present invention. The output signal (OUTPUT) 106 of the external amplifying circuit 105 shown in FIG. 9 is converted into a digital signal of N bits by AD conversion and then input to the circuit shown in FIG. 10 as an input digital signal 114.

A digital signal 107 of M bits of the comparator 64 mentioned above is input to a gain correcting unit 108 to be converted into a gain correcting value.

The N-bit digital signal noise-canceled by a one-H memory 109 and an adder 110 is passed through a multiplier 111 to be corrected by the gain correcting value, and further passed through an adder 112 to be converted into a digital signal of N bits and M bits for output (113).

A case where the circuit shown in FIG. 10 is formed on the same chip of the solid-state image pickup device corresponds to a case where the AD circuit is included in the column as shown in FIG. 2 or a case where the AD circuit is included in a region other than the column on the same chip. The output signal 106 from the amplifying circuit 18 is converted into a digital signal of N bits by the on-chip AD circuit.

Thus, by combining the signal with the M-bit digital signal 107 of the above-mentioned comparator 64, it is possible to readily obtain the digital signal of N+M bits. The gain correcting circuit 30 multiplies the N-bit signal by M bits for a gain of one, and outputs the N-bit signal as it is for a gain of eight.

Such a circuit architecture makes it possible to construct a CMOS image sensor that improves the S/N ratio at the time of output of a small signal and has a wide dynamic range of N+M bits.

Figure 11:
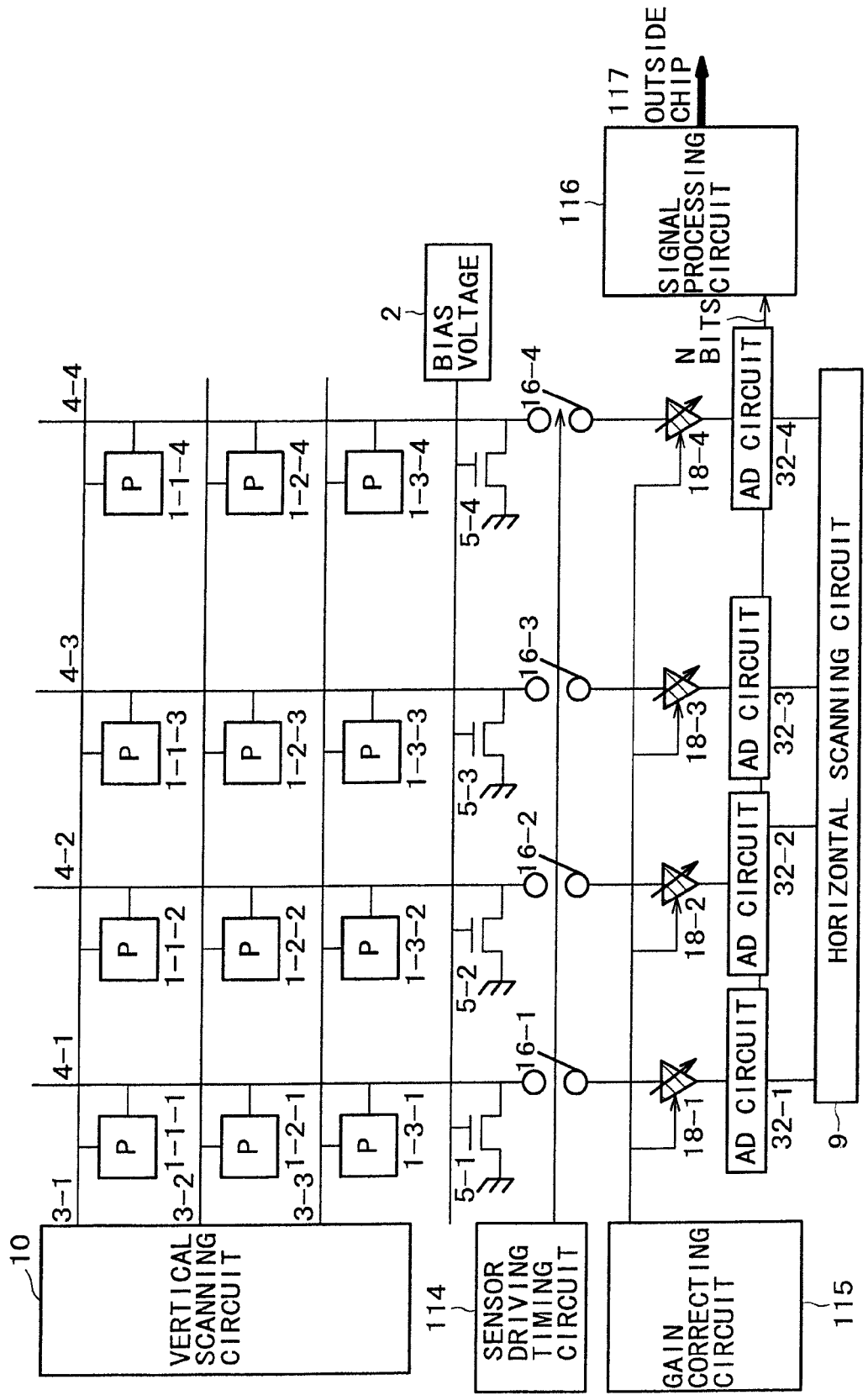
FIG. 11 is a circuit diagram showing a CMOS image sensor according to a tenth exemplary embodiment of the present invention.

FIG. 11 is a circuit diagram showing a tenth embodiment of a CMOS image sensor. In the above examples, signal level is detected independently pixel by pixel in the column region unit, and the result is fed back to the gain amplifier disposed in each column region unit to thereby change a gain of the gain amplifier. When the configuration to that extent is not required, however, it can be simplified to a configuration as shown in FIG. 11.

In the example shown in FIG. 11, each column region unit has an amplifying circuit 18 and an AD circuit 32 having a data retaining function. As another method, the column region unit may be formed of only an amplifying circuit and an S/H circuit. Such a formation is also included in the scope of the present invention.

An amplification factor of each amplifying circuit 18 is controlled by a gain control circuit 115 disposed externally. That is, the amplifying circuit is not set to an amplification factor independently optimized for each pixel as in the foregoing embodiments, the same gain setting is provided for pixel signal levels of one row.

Incidentally, in an actual solid-state image pickup device, the gain is changed in units of one frame. When signal level of a screen as a whole becomes lower than a certain threshold value, the gain is changed during a vertical blanking period.

The tenth embodiment thus simplified makes it possible to reduce the number of components disposed in the column region unit. The tenth embodiment thus makes it possible to reduce chip area, or has great effects in reducing the chip area.

According to the above embodiments, mainly the following effects can be obtained:

1) Even with the column system, a signal of each pixel can be independently amplified at an optimum gain and thereafter provided as an output.

2) The S/N ratio of a pixel at the time of a small signal output can be substantially improved, whereby a highly sensitive solid-state image pickup device can be achieved.

3) A 12-bit AD circuit and the setting of an amplification factor in three steps or more within a column can provide a wide dynamic range of 15 bits or more.

4) Even when AE, flicker correction, gamma correction, shading correction, color balance and other processing are performed in the digital domain, the S/N ratio is not degraded and thus an image of high quality can be readily achieved.

It is to be noted that while in the above description, configurations in cases where the present invention is applied to a CMOS image sensor as a separate unit have been described, the present invention can be applied to various electronic apparatus including a solid-state image pickup device as described above, such as camera apparatus, portable terminals, personal computers and the like, and thereby contribute to increase in performance and the like of the image pickup unit of these apparatus, and therefore the apparatus are included in the scope of the present invention.

In addition, the present invention is also applicable to highly sensitive CMOS image sensors of other configurations and mixed CCD-CMOS sensors that are combined with CCDs.

Further, for other concrete configurations, various modifications may be made without departing from the spirit of the present invention.

We claim:

1. A solid-state image pickup device comprising:
    a photoelectric converting unit having a plurality of pixels, disposed in a two-dimensional array;
    a vertical signal line disposed for each pixel column of said photoelectric converting unit;
    a column unit disposed at an output of said vertical signal line, for sequentially storing the pixel signal of each pixel read by said vertical signal line; and
    an output unit for sequentially reading the pixel signals stored in said column unit and outputting a corresponding signal;
    wherein said column unit has a means for controlling amplification of the pixel signal on a pixel-by-pixel basis in order to provide an output; wherein said column unit includes a detecting circuit for detecting the level of the pixel signal output from said vertical signal line and then classifying the level into a predetermined level range; and an amplifying circuit for amplifying the pixel signal output from said vertical signal line; and wherein a division signal from said detecting circuit is output from the column unit.

2. A solid-state image pickup device as claimed in claim 1, and further wherein said column unit includes gain setting means for setting a gain of said amplifying circuit according to a result from the detecting circuit.

3. A solid-state image pickup device as claimed in claim 1, and further wherein at least one pair of said amplifying circuit and said detecting circuit is provided for each pixel column of said photoelectric converting unit.

4. An electronic apparatus including a solid-state image pickup device, said solid-state image pickup device comprising:
    a photoelectric converting unit having a plurality of pixels disposed in a two-dimensional array;
    a vertical signal line for each pixel column of said photoelectric converting unit for sequentially reading a pixel signal;
    a column unit external to said photoelectric converting unit for sequentially storing the pixel signal from each pixel read by said vertical signal line;
    the column unit including a detecting circuit for detecting a level of the pixel signal read by said vertical signal line and then classifying the level into a predetermined level range and controlling an amplifying circuit for amplifying the pixel signal output from said vertical signal line on a pixel-by-pixel basis; and further wherein said solid-state image pickup device outputs a division signal corresponding to the detected level of the pixel signal from the column unit.

5. An electronic apparatus as claimed in claim 4, and further wherein said column unit of said solid-state image pickup device includes gain setting means for setting a gain of said amplifying circuit according to a result from said detecting circuit.

* * * * *